United States Patent [19]

Maniar

[11] Patent Number: 5,391,393
[45] Date of Patent: * Feb. 21, 1995

[54] METHOD FOR MAKING A SEMICONDUCTOR DEVICE HAVING AN ANHYDROUS FERROELECTRIC THIN-FILM IN AN OXYGEN-CONTAINING AMBIENT

[75] Inventor: Papu D. Maniar, Austin, Tex.

[73] Assignee: Motorola, Inc., Schaumburg, Ill.

[*] Notice: The portion of the term of this patent subsequent to Dec. 21, 2010 has been disclaimed.

[21] Appl. No.: 108,278

[22] Filed: Aug. 19, 1993

Related U.S. Application Data

[63] Continuation-in-part of Ser. No. 864,281, Apr. 6, 1992, Pat. No. 5,271,955.

[51] Int. Cl.$^6$ ................................................. B05D 5/12
[52] U.S. Cl. ............................... 427/100; 427/126.2; 427/126.3; 427/226; 427/240; 427/372.2; 427/377; 427/384; 437/231
[58] Field of Search .............. 437/231; 427/126.2, 427/126.3, 226, 240, 372.2, 384, 126.4, 100, 377

[56] References Cited

U.S. PATENT DOCUMENTS

| | | | |
|---|---|---|---|
| 4,946,710 | 8/1990 | Miller et al. | 427/126.3 |
| 4,963,390 | 10/1990 | Lipeles et al. | 427/110 |
| 5,160,762 | 11/1992 | Brand et al. | 427/79 |

OTHER PUBLICATIONS

S. D. Ramamurthi, et al., "Structural Investigations of Prehydrolyzed Precursors Used in the Sol-Gel Processing of Lead Titanate", J. Am. Ceram. Soc., 73 (8) pp. 2547-2551, (1990), (no month).

T. W. Dekleva, et al., "Sol-Gel Processing of Lead Titanate in 2-Methoxyethanol: Investigations into the Nature of the Prehydrolyzed Solutions", Comm. of Amer. Soc., J. Am. Ceram. Soc., 71 (5), pp. C-280-C282 (1988) (no month).

*Primary Examiner*—Janyce Bell
*Attorney, Agent, or Firm*—Jasper W. Dockrey

[57] ABSTRACT

A method for making a semiconductor device having an anhydrous ferroelectric thin-film obtained from an anhydrous sol-gel solution. An anhydrous PZT sol-gel solution is provided, wherein the sol-gel solution is prepared from lead (II) acetate anhydrous, which is heated with zirconium and titanium precursors to form a gel. The sol-gel solution is prepared without hydrolyzing the solution to obtain precursor complexes which do not contain water. The sol-gel is then applied to a semiconductor substrate and crystallized to form a ferroelectric thin-film. In a preferred embodiment, one or more steps of preparing the sol-gel solution, applying the sol-gel solution, and crystallizing the sol-gel solution are carried out in the presence of an oxygen-containing ambient.

17 Claims, 2 Drawing Sheets

METHOD FOR MAKING A SEMICONDUCTOR DEVICE HAVING AN ANHYDROUS FERROELECTRIC THIN-FILM IN AN OXYGEN-CONTAINING AMBIENT

RELATED APPLICATION

This application is a continuation-in-part of a commonly assigned, patent application having Ser. No. 07/864,281, and filed Apr. 6, 1992, now U.S. Pat. No. 5,271,955.

FIELD OF THE INVENTION

This invention relates in general to a method for fabricating a semiconductor device, and more particularly to a method for fabricating a semiconductor device having an anhydrous PZT ferroelectric thin-film formed by the application of a sol-gel solution to a semiconductor substrate.

BACKGROUND OF THE INVENTION

As the overall dimensions of semiconductor devices continue to shrink, the demand is ever increasing for devices having high charge storage capacity. The need for high charge storage capability is a result of the reduction in the chip area available for individual components as circuits are scaled to smaller dimensions. As the surface area of a component, such as a capacitor is reduced, a corresponding reduction in charge storage capability occurs. The smaller surface area available for components such as transistors, capacitors, and the like, coupled with the requirement to maintain high charge storage levels has motivated research for new materials from which to construct the components. One group of promising new dielectric materials is the family of PZT ceramic dielectrics. The PZT dielectrics are ferroelectric compounds of lead, zirconium and titanium oxides; hence the acronym "PZT."

Ferroelectric compounds are capable of being polarized by an applied voltage and retaining the polarization after the applied voltage has been removed. Responding to an applied voltage, the ferroelectric material assumes one of two remanent polarization states after the applied voltage is withdrawn. The ability to polarize a PZT ferroelectric and to design circuitry to detect the polarization state, makes the ferroelectric a desirable compound from which to construct non-volatile memory devices, such as non-volatile random access memory devices, and the like.

Thin films of PZT ferroelectric materials are commonly formed on semiconductor substrates using sol-gel process technology. Sol-gel processing provides a means of forming a thin PZT layer on a semiconductor substrate using existing spin-coating equipment. See for example, U.S. Pat. No. 4,946,710 to, W. D. Miller, et al., entitled, "Method for Preparing PLZT, PZT and PLT Sol-Gels and Fabricating Ferroelectric Thin Films", and U.S. Pat. No. 4,963,390 to R. A. Lipeles, et al., entitled, "Metallo-Organic Solution Deposition (MOSD) Of Transparent Crystalline Ferroelectric Films". Typically, a solution containing the desired metal elements is prepared by dissolving organometallic precursors in different organic solvents, then, mixing the various solutions together. After mixing, the solution is hydrolyzed to form a sol-gel solution. Following hydrolysis, the sol-gel solution is dispensed onto a semiconductor substrate. The substrate is held stationary, or is slowly spinning until the sol-gel solution is dispensed. Then, the spin speed is rapidly increased to drive off the solvents, and to leave a viscous sol-gel layer on the substrate surface. The amorphous sol-gel layer is then baked and sintered to form a perovskite crystalline compound having the general formula $ABO_3$. In the PZT film, the A site is occupied by lead, and the B site is occupied by zirconium and titanium. In addition, a dopant such as lanthanum can be incorporated into the perovskite crystal in the A site location. The film is then commonly referred to as "PLZT."

While sol-gel technology has been widely used for the formation of PZT and PLZT thin-films, improvement the in sol-gel process is needed. In many cases, the PZT films do not exhibit optimum ferroelectric properties, such as high charge storage ability needed in a DRAM, nor the maximized remanent polarization necessary to meet non-volatile memory requirements. The non-optimum ferroelectric performance is often associated with an inability to completely crystallize an amorphous PZT material into the desired perovskite crystalline phase. Additionally, the ferroelectric film compositions vary from one process run to the next leading to non-reproducible film properties. An improved sol-gel process was therefore needed to provide a high quality, crystalline PZT and doped PZT films, wherein the amorphous sol-gel material is substantially converted to the perovskite crystalline phase.

BRIEF SUMMARY OF THE INVENTION

In practicing the present invention there is provided a method for making a semiconductor device having an anhydrous ferroelectric thin-film. The ferroelectric film is a PZT thin-film which may be doped with one or more metals including aluminum, antimony, iron, lanthanum, manganese, niobium, tantalum, and vanadium. The ferroelectric film is formed by applying an anhydrous sol-gel solution to a semiconductor substrate. In one embodiment of the invention, a semiconductor substrate and an anhydrous PZT sol-gel solution are provided. The anhydrous PZT sol-gel is synthesized in the absence of an hydrolysis step by heating lead acetate anhydrous and zirconium and titanium precursors, wherein each precursor is solubilized in a common anhydrous organic solvent. The anhydrous PZT sol-gel solution is then applied to the semiconductor substrate to form an anhydrous sol-gel coating overlying the substrate. After application, the anhydrous sol-gel coating is crystallized to form a ferroelectric thin-film. In a preferred embodiment, one or more steps of synthesizing the sol-gel solution, applying the sol-gel to a substrate, and crystallizing the sol-gel are carried out in the presence of an oxygen-containing ambient.

DETAILED DESCRIPTION OF THE INVENTION

The formulation method of the present invention provides a sol-gel solution for the formation of a PZT ferroelectric thin-film in a semiconductor device. The PZT ferroelectric thin-film is a metal oxide containing lead and one or more metals from the group consisting of zirconium and titanium. In addition, the PZT film can also contain dopants such as antimony, iron, lanthanum, manganese, niobium, tantalum, and vanadium. The PZT thin-film is formed on a semiconductor substrate by spin-coating the sol-gel solution onto the substrate. To formulate a sol-gel solution in accordance with the present invention, an anhydrous form of lead acetate is used in a novel, anhydrous formulation procedure. The resulting anhydrous sol-gel solution exhibits prolonged shelf-life and enhanced resistance to degradation caused by atmospheric humidity. In addition, crystalline PZT thin-films formed with the anhydrous sol-gel solution have a uniform grain size and are substantially converted to the perovskite please during sintering. Furthermore, the PZT films formed in accordance with the invention exhibit improved durability over PZT films of the prior art. The improved durability is shown by strong resistance to peeling and cracking in PZT thin-films formed on silicon substrates. Moreover, compared to PZT films formed using procedures of the prior art, the PZT thin-films formed in accordance with the invention show improved ferroelectric characteristics, such as high charge storage, resistance to dielectric breakdown and high remanent polarization.

In accordance with one embodiment of the invention, a lead-zirconium-titanate (PZT) sol-gel solution is formulated having varying stoichiometric amounts of lead (Pb), zirconium (Zr), and titanium (Ti). Sol-gel compositions are commonly designated by the generalized formula, $PbZr_xTi_yO_3$. In the general formula, the subscripts are related as, $x+y=1.0$. The subscripts then represent moles of Zr and Ti. Following the procedure of the present invention, PZT sol-gel solutions have been prepared having the number of moles of Zr ranging from $x=0.20$ to $0.65$ and the number of moles of Ti ranging from $y=0.35$ to $0.80$.

Furthermore, in many applications it is desirable to add excess Pb to the formulation. The excess Pb is often added to enhance the liquid phase sintering process carried out prior to crystallization and to replace Pb that is volatilized during thermal treatment. The formulations listed above have been prepared with excess Pb ranging from 0 to 20 mole %. As used herein, the term excess refers to any molar amount exceeding that necessary to meet the stoichiometric requirement indicated by the ideal formula $PbZr_xTi_yO_3$.

Figure 1:
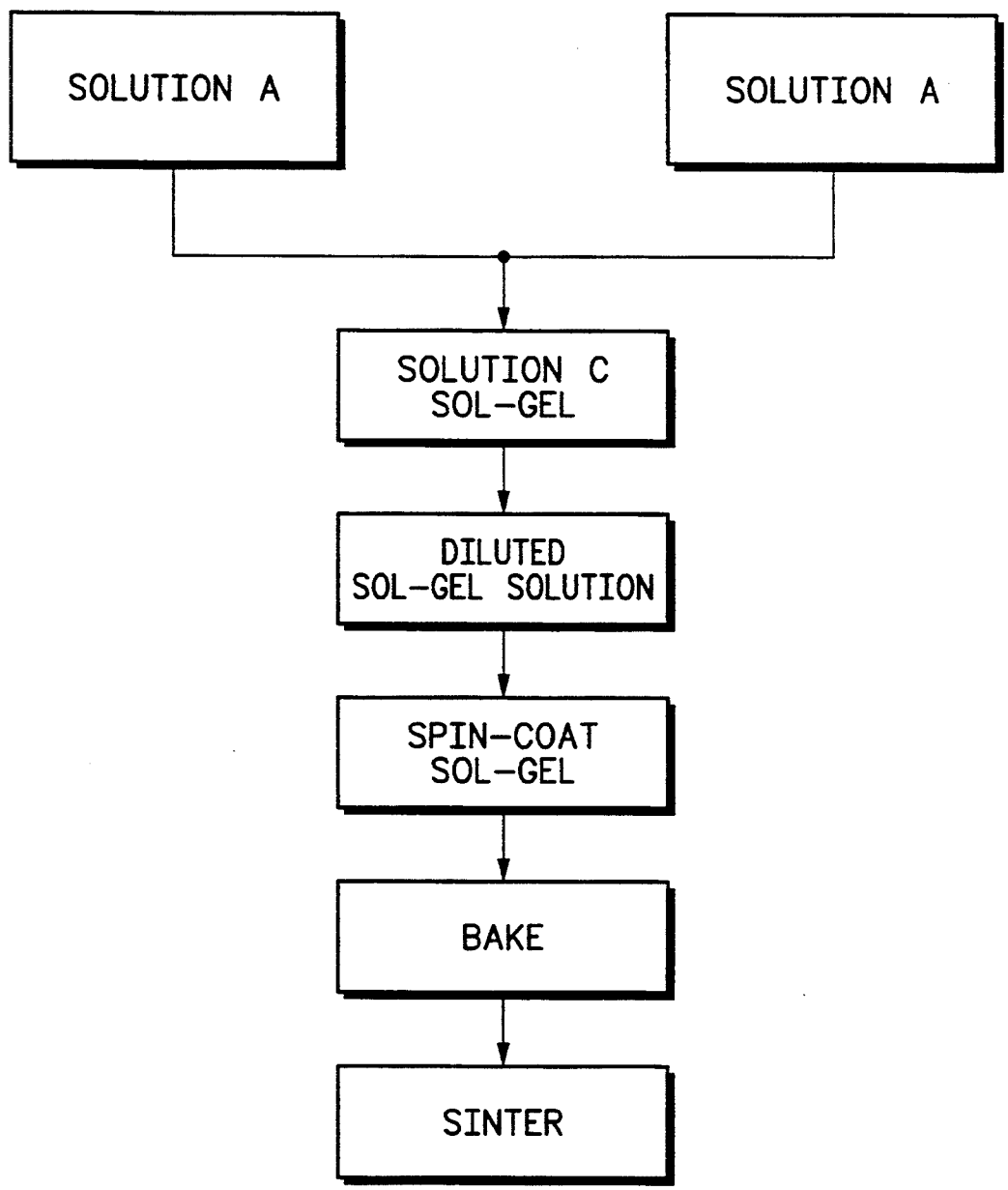
FIG. 1 schematically illustrates, in accordance with the invention, the steps for preparing an anhydrous PZT sol-gel solution and applying the anhydrous PZT sol-gel to a semiconductor substrate.

A procedure for formulating and applying the anhydrous sol-gel solution of the invention is schematically illustrated in FIG. 1. The procedure for formulating the anhydrous sol-gel solution of the invention is preferably carried out in an oxygen-containing ambient, taking care to exclude atmospheric moisture. For example, all solution preparation and handling steps can be performed in a gas-purged glove box. The glove box is preferably purged with oxygen. However, another oxygen-containing ambient such as dry compressed air can also be used. In addition, other oxygen-containing gases can be used, such as mixtures of oxygen and an inert gas. Representative examples of inert gases include nitrogen, argon, helium, and the like.

To begin preparation, a selected volume of an anhydrous solvent is preheated to about 90°–100° C. The anhydrous solvent is preferably an alkoxy alcohol, such as methoxyethanol, 1-methoxy-2-propanol, 3-ethoxy-1-propanol, 3-methoxy-1-butanol, and the like. A predetermined amount of lead (II) acetate anhydrous (Pb—Ac anhy), is solubilized in the preheated solvent to form a lead precursor solution, solution A. In accordance with the invention, other metal constituents can be added to the solvent by the addition of a metal containing compound such as a metal alkoxide, a metal betadiketonate, or a metal acetate. For example, lanthanum isopropoxide can be added to the solvent to form a lead-lanthanum precursor solution. Alternatively, the lanthanum containing compound can be anhydrous lanthanum acetate, or anhydrous lanthanum acetylacetonate. In addition, metal salts can be used such as metal chlorides and nitrates, and the like.

After adding the metal precursors, solution A is heated for an amount of time sufficient to completely dissolve all solute materials and to propagate on-going reactions. During heating, about 3 to 10% of total solution volume is volatilized. Of course, the amount of solution volatilized will depend upon the vapor pressure of the particular anhydrous solvent. In addition to completing the solubilization of precursors, the heating step induces a reaction between the precursors and the solvent. It is to be noted that a dehydration step to remove water from the lead acetate is not necessary because the anhydrous form of lead acetate is used. Furthermore, anhydrous lead acetate shows enhanced reactivity with other precursors used in the sol-gel formation process. This is a distinct advantage of the present invention. Formulations of the prior art, wherein a dehydration step is used, have not resulted in the complete removal of water from the precursor compounds, see for example "Structural Investigations of Prehydrolyzed Precursors Used in the Sol-gel Processing of lead Titanate," S. Ramamurthi et al., J. Am. Ceram. Soc., 71, 1990.

The inventive process continues with the preparation of a solution of Zr and Ti by dissolving alkoxides of Zr and Ti in a predetermined quantity of solvent to form solution B. The preferred alkoxides are zirconium n-butoxide butanol complex and titanium isopropoxide; however, other alkoxide compounds such as titanium ethoxide, titanium butoxide, zirconium ethoxide and zirconium propoxide, and the like, can also be used. To enhance dissolution, the solvent is pre-heated to about 40°–50° C. prior to addition of the alkoxides. The solution is then gently mixed for a predetermined time.

In addition to Zr and Ti precursors, dopant atoms can also be introduced into solution B to alter the physical and electrical characteristics of the anhydrous PZT thin-film produced with the sol-gel. The dopant can be a material which will affect the ferroelectric properties of the PZT thin-film. Within the scope of the present invention are alkoxide compounds having the formula $M(OR)x$, where x can be a number ranging from 3 to 5 depending upon the particular metal. The particular metals include antimony (Sb), manganese (Mg), tantalum (Ta), niobium (Nb), lanthanum (La), and aluminum (Al). Also included are chlorides and acetates of iron (Fe), and vanadium (V), such as iron (II) acetate (Fe(OOCCH$_3$)$_2$ and vanadium trichloride (VCl$_3$). In a preferred embodiment, M is La, Fe, Nb, or Al, and R is isopropyl; however, metals having other alkyl groups such as methyl, ethyl, butyl, and the like, and metal acetates, metal betadiketonates, and metal salts can also be used.

In general, to maintain each precursor solution at maximum homogeneity, the dopant compounds are added to either the Pb solution or the Zr/Ti solution depending upon the atomic size and valence of the dopant atom. For example, La is added to the Pb solution because the La atom substitutes for Pb in the final perovskite crystal lattice of the PZT film. Correspondingly, Fe, Al, and Nb are added to Zr/Ti precursor solution because their atomic size and valence correspond more closely to Zr and Ti than to Pb. The addition of dopant atoms to each precursor solution according to their relative atomic size results in a more homogeneous PZT thin-film having a uniform concentration of each film constituent. However, in cases where only a small concentration of dopant is desired, a dopant solution can be prepared separately, and the dopant solution mixed with the final sol-gel solution.

Also, one skilled in the art will recognize that the characteristics of the PZT thin-film formed from a sol-gel solution can be affected by altering the amount of the lead precursor. For example, as described above, an amount of lead in excess of that necessary to meet the stoichiometric reaction requirement can be incorporated by increasing the molar amount of Pb—Ac anhy relative to the molar amounts the Ti and Zr precursors.

It should be noted that, in the present invention, a common solvent is used for precursor solutions A and B. However, many sol-gel processes of the prior art, use either a different solvent for each precursor, or, a common solvent for Pb and La, and a different solvent for Zr and Ti. As a result of solvent association, the solubilization of the metal precursors in different solvents hinders the formulation of a homogeneous sol-gel solution. In the present invention, solvent association is eliminated by the use of a common solvent for all metal precursors solutions. The solubilization of the Pb, La, Zr and Ti precursors in a common solvent results in a PZT film with few particles and striations. PZT films of the prior art are prone to striations as a result of the variation in volatility of the different solvents used for each precursor. During the spin coating process, the solvents evaporate at different rates leaving striations in the film. In addition, the use of a common solvent reduces particle formation in the PZT film during spin coating.

As previously noted, sol-gel processing of the prior art uses a different solvent for each metal precursor solution. In addition, typically, a special solvent, such as isopropyl alcohol, is used in the conduits and orifices of the spin coating machine. Particles can be formed when a sol-gel solution having a number of different solvents is introduced to the spin coater liquid distribution system. The PZT sol-gel solution interacts with the spin coater solvent forming particles during sol-gel deposition. In the present invention, the use of a common solvent for all metal precursors minimizes the total number of solvents in the spin coater, thereby reducing the instance of particle formation during sol-gel deposition. Solvent interaction is minimized because, at most, only two solvents are present in the spin coater; the common precursor solvent and the spin coater solvent.

Once precursor solutions A and B are prepared, an anhydrous sol-gel solution is formed by mixing solutions A and B together and heating the mixture to form solution C. The anhydrous sol-gel solution is formed by mixing solution A into solution B while maintaining the temperature of the mixture at about 90°–100° C. After mixing, the solution is heated to form a homogeneous mixture. The completion of the homogenization process can be determined either by weight loss, or the solution can be heated for a predetermined amount of time. For the large-scale production of sol-gel, weight loss is the preferred method for determining completion of homogenization. In the present case, a weight loss of about 3 to 10% of the initial solution weight of solutions A and B indicates completion of the homogenization process. The resulting concentrated, anhydrous sol-gel solution contains a complex mixture of the metal precursors and the solvent. The homogenization is accompanied by the volatilization of a portion of the solvent and by-products of the homogenization process.

As previously noted, in a case where only a small amount of dopant, such as lanthanum is to be added, preferably, a separate solution is prepared and added to the sol-gel solution. This is advantageous because for very low doping levels, such as less than about 1 mole %, directly adding lanthanum to the Pb—Ac anhy does not provide a uniform lanthanum distribution in the deposited ferroelectric film. Accordingly, in an alternate embodiment, one of the previously described dopant compounds, for example lanthanum isopropoxide, is added to the anhydrous organic solvent to form a dopant solution in an analogous manner to the preparation of a precursor solution. A desired amount of the dopant solution is then mixed with the anhydrous sol-gel solution to form a doped PZT sol-gel solution.

An important aspect of the present invention includes the formation of the sol-gel solution by a thermal homogenization process. In the prior art, a sol-gel is formed by first mixing the precursor solutions, then hydrolyzing the solution. The formation of the sol-gel by thermal homogenization, rather than by hydrolysis, results in a more homogeneous solution. While not wishing the invention to be limited by any particular theory, the inventor believes the homogenization process, carried out between precursors which are not complexed with water, provides a more uniform distribution of metals in solution and results in improved PZT film properties.

Following the final heating step, in one embodiment, the concentrated solution is diluted with a sufficient quantity of solvent to replace the amount of solvent which was volatilized during the previous heating steps. The dilution step, which is optional, also adjusts the molar concentration of each precursor to a desired level. The diluted sol-gel solution is allowed to stand for at least three hours. Next, the diluted solution is filtered through a filter having a pore size of about 0.2 to 1.0 micron. The diluted sol-gel solution can now be directly applied to a semiconductor substrate, or alternatively, the solution can be stored for a period of time prior to use. In comparison to sol-gel solutions of the prior art, the anhydrous sol-gel solution of the present invention shows improved stability. The shelf-life of solution C is at least about ten to twelve weeks.

In another embodiment of the invention, rather than using an open heating method, solutions A and C can be refluxed in a closed apparatus designed for that purpose. If refluxing is used, it is unnecessary to replace the solvent. However, in the case of refluxing, reaction by-products remain in solution. The effect of the unvolatilized by-products must be taken into account when the PZT film is formed and may affect the film properties.

After allowing the sol-gel solution to stand for a minimum of about three hours, it can be applied to a semiconductor substrate, as illustrated in FIG. 1. In one embodiment, the sol-gel is applied by a conventional spin coating method. When applied to a semiconductor substrate, the sol-gel solution is applied onto the substrate surface directly from the diluted solution. Again, it should be noted that, unlike sol-gel application processes of the prior art, a hydrolysis is step is not included prior to applying the sol-gel to a semiconductor substrate. In the present invention, a sol-gel solution having precursor compounds with a minimal degree of internal steric hindrance and maximum homogeneity is obtained. The addition of water, as commonly introduced by hydrolysis, would form large, bulky precursor molecules having a high degree of internal strain. In addition, hydrolyzed precursors preferentially polymerize with a single metal element. While the inventor does not wish the invention to be limited by any particular theory, it is believed that producing a sol-gel solution having precursors with a minimal degree of steric hindrance and maximum homogeneity results in a corresponding PZT thin-film having a highly uniform concentration of metal atoms. The uniform concentration of metal atoms in turn provides a film having superior ferroelectric characteristics.

After the sol-gel solution is applied to the substrate, the coated substrate is preferably baked in an oxygen containing ambient at about 250° to 350° C., for about 30 seconds to 10 minutes. The baking can be performed on a heated plate, or alternatively, in a convection oven. The bake drives of the solvent and the organic ligands attached to the metals leaving an amorphous PZT film on the substrate surface. The coating and baking steps can be repeated to deposit successive layers of sol-gel onto the substrate. In this manner a PZT film can be formed to any desired thickness.

Finally, a sintering process is carried out to interdiffuse the metals and form a perovskite PZT thin-film. The sintering process can be carried out in a convection system, such as a standard diffusion furnace, or an open atmospheric oven. In a preferred embodiment, sol-gel is sintered in an oxygen containing ambient at a temperature of about 550° to 800° C. for about 5 to 30 minutes to crystallize the sol-gel. Alternatively, the sintering process can be performed in a rapid thermal annealing system at about 550° to 800° C. for about 5 seconds to 5 minutes. The extent of crystallization of the sol-gel can vary depending upon sol-gel composition and sintering conditions. In some cases portions of the PZT film will remain in an amorphous state following the sintering step. In a preferred embodiment, the sol-gel is substantially completely crystallized.

A particular advantage of the present invention is the relatively low temperature at which formation of perovskite crystalline phase takes place. As a result of the reduced steric hindrance within the precursor molecules and good homogeneity in the sol-gel solution, a film having a more uniform metal concentration is obtained. In addition, the metals diffuse more readily during sintering. The preparation of a homogeneous sol-gel solution having less sterically hindered precursor species functions to lower the temperature at which the perovskite crystalline phase is formed. A distinguishing characteristic of the PZT film, formed in accordance with the invention, is the reduced incidence of an intermediate and undesired pyrochlore phase during crystallization.

Without further elaboration, it is believed that one skilled in the art can, using the preceding description, utilize the invention to its fullest extent. The following preferred specific embodiments are, therefore, to be construed as merely illustrative, and not limitative of the remainder of the disclosure in any way whatsoever.

EXAMPLES I-II

A 0/50/50 PZT sol-gel solution having excess Pb was synthesized according to the following procedure. To begin the synthesis, all materials were placed in a glove box, and a gas was introduced to the glove box. In each of the two examples, either oxygen or dry, compressed air was introduced into the glove box. All synthesis and processing steps were otherwise the same for each example. The precursors and the solvent are commercially available from Prochem, Inc. of Rockford, Ill., as, lead (II) acetate anhydrous, F.W.=325.2, lanthanum isopropoxide, F.W.=316.2, zirconium n-butoxide butanol complex, F.W.=457.8, titanium isopropoxide, F.W.=284.3, and 2-methoxyethanol, F.W.=76.03, normal b.p. about 125° C.

First, about 326 ml of 2-methoxyethanol is preheated to about 90° to 100° C. Then, 66.94 g of Pb—Ac anhy was added to the 2-methoxyethanol to form a 0.632 molar solution. As mentioned previously, it is often desirable to add excess Pb—Ac anhy to improve film sintering. Accordingly, about 10 mole % excess lead was added to the solution. The addition of 6.69 g of Pb—Ac anhy resulted in a solution having 0.693 moles per 1000 cubic centimeters of 2-methoxyethanol.

After dissolving the Pb—Ac anhy, the Pb precursor solution was boiled at about 125° C. for about 30 minutes without stirring. The boiling volatilized a portion of the 2-methoxyethanol and reduced the solution volume by about 5% of total volume. The amount of volatilized solvent was determined by measuring the solution volume, before and after boiling, at a base point temperature within the range of 90° to 100° C. This solution corresponds to solution A shown in FIG. 1.

Next, about 75 ml of 2-methoxyethanol was heated to about 40° to 50° C., and 47.12 g of Zr n-butoxide butanol complex was added to the 2-methoxyethanol to form a 1.37 molar solution of Zr n-butoxide butanol complex. Then, 29.25 g of titanium isopropoxide was added to the Zr solution to form an equimolar solution of Zr and Ti. Since it is desired to form an equimolar film of Zr and Ti, the molar amount of Ti added must necessarily be the same as the molar amount of Zr. The combined Zr and Ti precursor solution is then stirred for about 5 minutes while maintaining the solution temperature at about 40° to 50° C. This solution corresponds to solution B shown in FIG. 1

The Zr/Ti solution was then added to the Pb precursor solution while maintaining the temperature of the mixture at about 90° to 100° C. The mixture was then boiled at about 125° C. for about 30 minutes without stirring to from the sol-gel solution. The boiling volatilized a portion of the 2-methoxyethanol and reduced the volume of the mixture by about 5% of total volume. After boiling, the concentrated sol-gel solution was cooled to room temperature, and the final solution volume was recorded. This solution corresponds to solution C shown in FIG. 1.

After a cooling period of about 24 hours, the sol-gel solution was diluted to form a sol-gel solution having molar precursor concentrations of 0.45M Pb—Ac anhy, 0.21M Zr n-butoxide butanol complex, and 0.21M titanium isopropoxide. The diluted sol-gel solution was then filtered through a 0.2 micron filter and bottled. The bottled sol-gel solution prepared in the oxygen-purged glove box was labeled and stored separately from the sol-gel solution prepared in the air-purged glove box.

After dilution and filtration, the sol-gel solution was dispensed directly onto several semiconductor substrates using a conventional spin-coating process. About 0.5 ml of sol-gel was dispensed onto the substrates and the substrates were rotated at about 3000 rpm to form a PZT layer on the substrate. Following spin-coating, the substrates were sequentially baked at 100° C., 200° C., and 300° C. for a period of 45 seconds at each temperature. The baking steps oxidized the organic ligands bonded to the metal atoms and vaporized the 2-methoxyethanol solvent leaving an amorphous PZT film having a thickness of about 80 nanometers. Successive layers of PZT, each having a thickness of about 80 nanometers were deposited to form a total film thickness of about 240. Finally, the substrates were split into two groups. One group was crystallized in an oxygen-purged convection furnace at about 650° C. for about 30 minutes. The other group was crystallized in an oxygen-purged rapid thermal annealing system at 725° C. for about 60 seconds.

Figure 2:
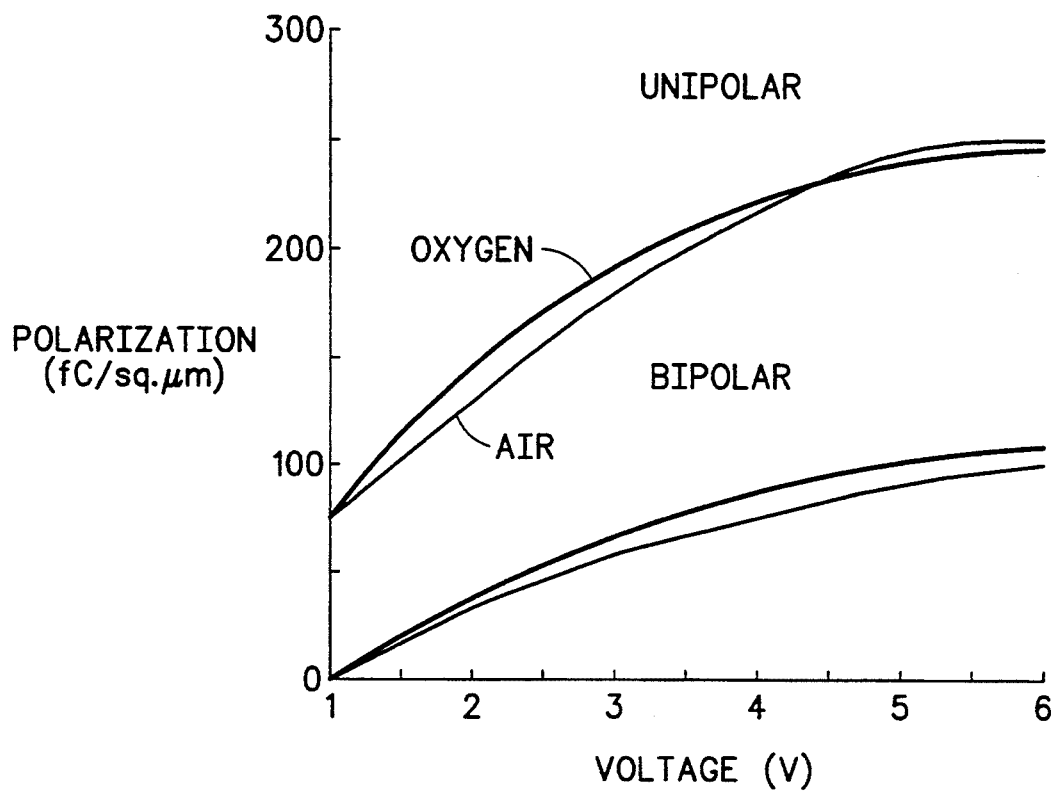
FIG. 2 is a plot of polarization versus applied voltage for ferroelectric capacitors, formed in accordance with the invention, having a ferroelectric dielectric layer crystallized in a convection furnace.

To examine the polariation characteristics of the PZT films, the films were deposited onto a first platinum layer overlying the substrate. The PZT films were then deposited according to the foregoing procedure. Following the crystallization of the PZT films, a second platinum layer was deposited on the PZT films to form capacitors, and polarization data was collected for each PZT film. The degree of polarization was determined by applying a voltage to the capacitors. Polarization as a function of applied voltage for the PZT film sintered in the convention furnace is illustrated in FIG. 2. The polarization characteristics are illustrated for both bipolar and unipolar charge states. The charge state is determined by the displaced charge density of the PZT film following application of a voltage pulse. The unipolar charge state is representative of the electrical environment found in a DRAM device using a PZT capacitor. Correspondingly, the bipolar charge state is representative of a non-volatile RAM device.

The plot of FIG. 2 indicates a slightly higher degree of polarization is attained at a given voltage for the oxygen-synthesized PZT than for the air-synthesized PZT, irrespective of applied voltage.

Figure 3:
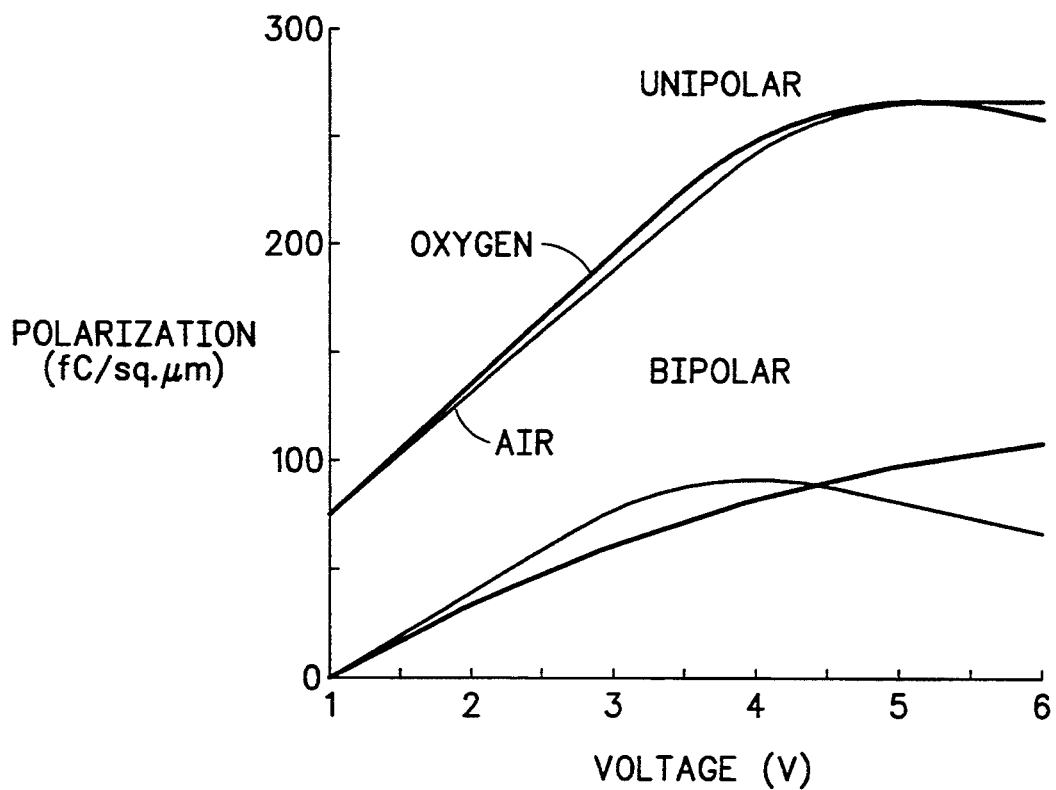
FIG. 3 is a plot of polarization versus applied voltage for ferroelectric capacitors, formed in accordance with the invention, having a ferroelectric dielectric layer crystallized in a rapid thermal annealing apparatus.

Polarization data for the PZT film sintered in a rapid thermal annealing apparatus is illustrated in FIG. 3. Again, polarization data for both charge states are shown. A comparison of the data plotted in FIGS. 2 and 3 indicates that a slightly greater degree of polarization is attained at higher voltage levels in biased PZT films, which were crystallized in the rapid thermal annealing apparatus. It should be noted that the polarization values reported in FIGS. 2 and 3 were obtained from non-annealed capacitors. If the capacitors are subsequently annealed it is possible to improve the polarization values by a factor of about two, regardless of the particular ambient used when forming the PZT film.

EXAMPLES III–IV

A 0/50/50 PZT sol-gel solution having excess Pb was synthesized according to the following procedure. All synthesis steps were carried out in a an oxygen-purged glove box. The precursors used were the same as described in Examples I and II. In the present examples, 3-methoxy-1-butanol was used as a common solvent, F.W.=104.15, normal b.p about 161° C. The solvent is commercially available from Prochem, Inc.

An anhydrous lead acetate solution was prepared by adding about 73.63 g (0.226 moles) of anhydrous lead acetate to about 315 g of 3-1methoxy-1-butanol. The solution was gently stirred for about 40 minutes until all of the anhydrous lead acetate completely dissolved. The temperature of the solvent was maintained at about 130° C.

A solution containing zirconium and titanium was prepared by adding about 47.12 g (0.103 moles) of zirconium n-butoxide butanol complex, and about 29.25 g (0.103 moles) of titanium isopropoxide to about 73 g of 3-methoxy-1-butanol. The solutes were added at room temperature to the 3-methoxy-1-butanol with continual stirring for a period of about 5 minutes.

Next, a sol-gel solution was formed by adding the zirconium/titanium solution to the lead acetate solution. The lead acetate solution was first heated to about 130° C., then the zirconium/titanium solution was added while gently stirring the lead acetate solution. The stirring was continued while the temperature returned to 130° C. Mixing the two solutions caused the temperature to drop to about 100 to 110° C. The mixture was then gently stirred while controlling the temperature rise at a rate of about 1° C. per minute to a maximum temperature of about 120° to 130° C.

In example III, the sol-gel solution was cooled to room temperature, then filtered, first through a 1 micron filter, then finally, through a 0.5 micron filter. After filtration, the sol-gel solution was bottled and removed from the oxygen-purged glove box.

In example IV, the sol-gel solution was cooled to about 30° C., then diluted with about 500 ml of isopropyl alcohol. The isopropyl alcohol dilution provided a sol-gel solution having a lower viscosity than the solution of example III. The lower viscosity allows the sol-gel solution to be filtered through a 0.2 micron filter removing a larger amount of particulate contamination. In addition, the spin-coating process is enhanced by permitting a wider amount of variation in the spin-coating parameters for the deposition of the sol-gel solution.

Thus it is apparent that there has been provided, in accordance with the invention, a method of making a semiconductor device having a PZT thin-film formed from an anhydrous sol-gel solution which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other deposition methods can be used to apply the sol-gel to a semiconductor substrate such as spray pyrolysis, and the like. It is therefore intended to include within the invention all such variations and modifications as fall within the scope of the appended claims and equivalents thereof.

I claim:

1. A method of making a semiconductor device comprising the steps of:
   providing a semiconductor substrate;
   providing an anhydrous sol-gel solution, wherein the solution is synthesized in the absence of an hydrolysis step by heating a mixture of lead acetate anhydrous and zirconium and titanium precursors, wherein each precursor is solubilized in an anhydrous organic solvent;

applying the anhydrous sol-gel solution onto the substrate to form an anhydrous sol-gel coating overlying the substrate; and crystallizing the anhydrous sol-gel coating, wherein one or more steps of synthesizing, applying, and crystallizing are carried out in the presence of an oxygen-containing atmosphore, selected from the group consisting of air, oxygen, and an oxygen gas mixture.

2. The method of claim 1, wherein the step of applying the anhydrous sol-gel comprises spin coating the anhydrous sol-gel onto the surface of the semiconductor substrate.

3. The method of claim 1, wherein the step of crystallizing the anhydrous sol-gel coating comprises thermally treating the anhydrous sol-gel coating at a temperature of 550° C. to 800° C.

4. The method of claim 1 further comprising baking the sol-gel coating in an oxygen-containing atmosphere prior to crystallizing.

5. The method of claim 1, wherein the anhydrous organic solvent is selected from the group consisting of methoxyethanol, 1-methoxy-2-propanol, 3-ethoxy-1-propanol, and 3-methoxy-1-butanol.

6. A method of making a sol-gel solution for application to a semiconductor substrate comprising the steps of:

solubilizing an anhydrous lead precursor to form a first precursor solution;

solubilizing amounts of titanium and zirconium precursors to form a second precursor solution;

mixing the first and second precursor solutions to form a mixture; and heating the mixture in the absence of an hydrolysis step to form the sol-gel solution, wherein one or more steps of solubilizing, mixing, and heating are carried out in an oxygen-containing atmosphere.

7. The method of claim 6, wherein the metal precursors forming the second precursor solution are selected from the group consisting of metal alkoxides, metal acetates, metal betadiketonates, metal chlorides and metal nitrates.

8. The method of claim 6, wherein the titanium precursor is titanium isopropoxide and the zirconium precursor is zirconium n-butoxide butanol complex.

9. The method of claim 6, wherein the precursors are solubilized in an anhydrous solvent selected from the group consisting of methoxyethanol, 1-methoxy-2-propanol, 3-ethoxy-1-propanol, and 3-methoxy-1-butanol.

10. The method of claim 6, wherein the step of heating comprises heating the mixture to about 125° C. for a period of time no less than 15 minutes.

11. The method of claim 6 further comprising solubilizing one or more metal precursors selected from the group consisting of iron, niobium, and aluminum in the second precursor solution.

12. The method of claim 6 further comprising solubilizing a lanthanum metal precursor in the first precursor solution.

13. The method of claim 6 further comprising the steps of:

preparing a lanthanum metal precursor solution; and adding the lanthanum precursor solution to the sol-gel solution.

14. A method of making a semiconductor device comprising the steps of:

providing a semiconductor substrate;

applying an anhydrous sol-gel solution onto the substrate to form an anhydrous sol-gel coating overlying the substrate, wherein the sol-gel solution is synthesized in the absence of an hydrolysis step by heating lead acetate anhydrous and zirconium and titanium precursors, and wherein each precursor is solubilized in an anhydrous organic solvent; and crystallizing the anhydrous sol-gel coating, wherein one or more steps of synthesizing, applying, and crystallizing are carried out in the presence of an oxygen-containing atmosphere.

15. The method of claim 14, wherein the step of crystallizing the anhydrous sol-gel coating comprises thermally treating the sol-gel coating in an apparatus selected from the group consisting of a convection furnace and a rapid thermal annealing system.

16. The method of claim 14, wherein the step of applying the anhydrous sol-gel solution comprises spin-coating.

17. The method of claim 14 further comprising the step of baking the sol-gel at a temperature of 250° to 350° C. prior to crystallizing.

* * * * *